(12) United States Patent
Zhan et al.

(10) Patent No.: US 12,336,300 B2
(45) Date of Patent: Jun. 17, 2025

(54) SEMICONDUCTOR DEVICES AND METHODS OF MANUFACTURING SEMICONDUCTOR DEVICES

(71) Applicant: SEMICONDUCTOR COMPONENTS INDUSTRIES, LLC, Phoenix, AZ (US)

(72) Inventors: Rouying Zhan, Chandler, AZ (US); Yupeng Chen, San Jose, CA (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 505 days.

(21) Appl. No.: 17/659,993

(22) Filed: Apr. 20, 2022

(65) Prior Publication Data
US 2023/0343777 A1      Oct. 26, 2023

(51) Int. Cl.
H10D 89/60 (2025.01)
(52) U.S. Cl.
CPC ................ H10D 89/713 (2025.01)
(58) Field of Classification Search
None
See application file for complete search history.

(56) References Cited

U.S. PATENT DOCUMENTS

| | | | | |
|---|---|---|---|---|
| 9,659,922 B2 * | 5/2017 | Zhan | ............. | H01L 29/36 |
| 10,186,506 B2 * | 1/2019 | Ryu | ............. | H01L 27/0266 |
| 10,361,185 B2 * | 7/2019 | Zhan | ............. | H01L 29/36 |
| 2014/0235026 A1 | 8/2014 | Zhan et al. | | |
| 2014/0367830 A1 * | 12/2014 | Zhan | ............. | H01L 29/1083 257/577 |
| 2015/0069424 A1 * | 3/2015 | Willemen | ......... | H01L 31/173 257/84 |
| 2016/0163691 A1 | 6/2016 | Edwards et al. | | |
| 2017/0077082 A1 | 3/2017 | Marreiro et al. | | |
| 2017/0236817 A1 * | 8/2017 | Zhan | ............. | H01L 27/0262 257/526 |

* cited by examiner

Primary Examiner — Telly D Green
(74) Attorney, Agent, or Firm — Kevin B. Jackson

(57) ABSTRACT

In an example, a semiconductor device includes a region of semiconductor material with a buried doped region of a first conductivity type. A first well region of the first conductivity type is in the region of semiconductor material and is electrically coupled to the buried doped region. A second well region of a second conductivity type is in the region of semiconductor material and has a first peak dopant concentration. A third well region of the second conductivity type abuts edges of the second well region. The third well region is interposed between the first well region and the second well region and has a second peak dopant concentration that is different than the first peak dopant concentration. A doped anode region of the second conductivity type is in the first well region, a doped cathode region of the first conductivity type is in the second well region, and a doped contact region of the second conductivity type is in the second well region. The semiconductor device can be configured as a semiconductor-controlled rectifier (SCR) ESD device where the controlling mechanisms for DC breakdown voltage and holding voltage are decoupled. Other related examples and methods are disclosed herein.

20 Claims, 6 Drawing Sheets

SEMICONDUCTOR DEVICES AND METHODS OF MANUFACTURING SEMICONDUCTOR DEVICES

CROSS-REFERENCE TO RELATED APPLICATIONS

Not applicable.

TECHNICAL FIELD

The present disclosure relates, in general, to electronics and, more particularly, to semiconductor device structures and methods of forming semiconductor devices.

BACKGROUND

When a charged object is brought into proximity to an uncharged or oppositely charged device, an electrostatic discharge (ESD) often occurs, particularly if the device includes conductive elements. As the excess charge carriers begin to flow from the charged object to the device, they can induce a breakdown of the intervening dielectric, reducing resistance for ensuing carrier flow and enabling a charge equalization to occur on a very short time scale, e.g., 100 ns. At this time scale, a relatively modest discharge can nevertheless present current and voltage levels more than the capabilities of most solid-state electronic devices.

ESD challenges exist for very small geometry small signal electronic devices where relatively short exposure (e.g., less than 5 ns) to excessive voltage can cause significant damage to the electronic devices. Previous clamping structures, such as semiconductor-controlled rectifier (SCR) structures, have been in certain ESD applications because of their small size. However, such SCR structures have performance issues including holding voltages (Vhold) that are too low (e.g., less than 3 volts), and DC breakdown or trigger voltages that are fixed (i.e., not adjustable). These limitations as well as others have prevented their use in emerging applications that require higher Vhold performance, such as automotive applications, and adjustable DC breakdown voltages for broader platform implementation.

Accordingly, structures and methods are needed that overcome the shortcomings of prior ESD devices, including structures and methods that result in ESD devices having higher holding voltages and adjustable DC breakdown voltages. In addition, it would be beneficial for the structures and methods to support a device architecture on a same platform to lower manufacturing costs and to be isolated from the underlying substrate to improve electrical performance.

Figure 1A:
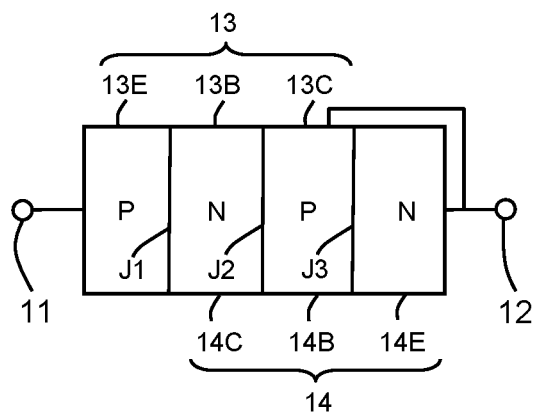
FIG. 1A is a simplified cross-sectional view of a semiconductor device configured as an electrostatic discharge (ESD) device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

For simplicity and clarity of the illustration, elements in the figures are not necessarily drawn to scale, and the same reference numbers in different figures denote the same elements. Additionally, descriptions and details of well-known steps and elements are omitted for simplicity of the description.

For clarity of the drawings, certain regions of device structures, such as doped regions or dielectric regions, may be illustrated as having generally straight-line edges and precise angular corners. However, those skilled in the art understand that, due to the diffusion and activation of dopants or formation of layers, the edges of such regions generally may not be straight lines and that the corners may not be precise angles.

Although the semiconductor devices are explained herein as certain N-type conductivity regions and certain P-type conductivity regions, a person of ordinary skill in the art understands that the conductivity types can be reversed and are also possible in accordance with the present description, taking into account any necessary polarity reversal of voltages, inversion of transistor type and/or current direction, etc.

In addition, the terminology used herein is for the purpose of describing particular examples only and is not intended to be limiting of the disclosure. As used herein, the singular forms are intended to include the plural forms as well, unless the context clearly indicates otherwise.

As used herein, "current-carrying electrode" means an element of a device that carries current through the device, such as a source or a drain of an MOS transistor, an emitter or a collector of a bipolar transistor, or a cathode or anode of a diode, and a "control electrode" means an element of the device that controls current through the device, such as a gate of a MOS transistor or a base of a bipolar transistor.

The term "major surface" when used in conjunction with a semiconductor region, wafer, or substrate means the surface of the semiconductor region, wafer, or substrate that forms an interface with another material, such as a dielectric, an insulator, a conductor, or a polycrystalline semiconductor. The major surface can have a topography that changes in the x, y and z directions.

The terms "comprises", "comprising", "includes", and/or "including", when used in this description, are open ended terms that specify the presence of stated features, numbers, steps, operations, elements, and/or components, but do not preclude the presence or addition of one or more other features, numbers, steps, operations, elements, components, and/or groups thereof.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

Although the terms "first", "second", etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure.

It will be appreciated by one skilled in the art that words, "during", "while", and "when" as used herein related to circuit operation are not exact terms that mean an action takes place instantly upon an initiating action but that there may be some small but reasonable delay, such as propagation delay, between the reaction that is initiated by the initial action. Additionally, the term "while" means a certain action occurs at least within some portion of a duration of the initiating action.

The use of word "about", "approximately", or "substantially" means a value of an element is expected to be close to a state value or position. However, as is well known in the art there are always minor variances preventing values or positions from being exactly stated.

Unless specified otherwise, as used herein, the word "over" or "on" includes orientations, placements, or relations where the specified elements can be in direct or indirect physical contact.

Unless specified otherwise, as used herein, the word "overlapping" includes orientations, placements, or relations where the specified elements can at least partly or wholly coincide or align in the same or different planes.

It is further understood that the examples illustrated and described hereinafter suitably may have examples and/or may be practiced in the absence of any element that is not specifically disclosed herein.

DETAILED DESCRIPTION OF THE DRAWINGS

In general, the present examples relate to semiconductor device structures and methods of making semiconductor devices, such as electrostatic discharge (ESD) devices that utilize a semiconductor-controlled rectifier (SCR) having a multiple-well design (for example, a P type conductivity double-well configuration) at the cathode side of the device, and in some examples, a doped region (for example, an N-type conductivity doped region) at the anode side of the device that modulates electric field build-up. The structure and method provide an SCR device with improved DC breakdown voltage (BV) and improved holding voltage (Vhold) performance. The doped well region at the anode side of the SCR device (for example, an N type conductivity well region) can be electrically coupled to a buried layer (for example, an N-type conductivity buried layer) either by directly contacting the buried layer or by using a deep trench contact structure. The multiple-well design enables a decoupling of the controls of DC breakdown voltage and holding voltage providing greater design flexibility. In some examples, the SCR device is isolated from the substrate, which enables stacking configurations to achieve higher BV and enables the use of different conductivity type substrates for flexible integration. In some examples, the substrate can be electrically coupled to the cathode of the SCR device at, for example, the package level, or the substrate can be electrically floating.

In an example, a semiconductor device includes a region of semiconductor material. The region of semiconductor material includes a top side, an opposing bottom side, a semiconductor substrate, a first semiconductor region over the semiconductor substrate, a buried doped region of a first conductivity type in the first semiconductor region, and a second semiconductor region over the first semiconductor region and the buried doped region. A first well region of the first conductivity type is in the second semiconductor region electrically coupled to the buried doped region. A second well region of a second conductivity type opposite to the first conductivity type is in the second semiconductor region and has a first peak dopant concentration. A third well region of the second conductivity type in the second semiconductor region abutting edges of the second well region, wherein the third well region is interposed between the first well region and the second well region, the third well region and the first well region are laterally spaced apart so that a portion of the second semiconductor region is interposed between the third well region and the first well region, and the third well region has a second peak dopant concentration that is different than the first peak dopant concentration. A doped anode region of the second conductivity type is in the first well region. A doped cathode region of the first conductivity type is in the second well region. A doped contact region of the second conductivity type is in the second well region.

In an example, a semiconductor device includes a region of semiconductor material with a top side, a bottom side opposite to the top side, a semiconductor substrate, a first semiconductor region over the semiconductor substrate, a buried doped region of a first conductivity type in the first semiconductor region; and a second semiconductor region over the first semiconductor region and the buried doped region. A first well region of the first conductivity type is in the second semiconductor region and is electrically coupled to the buried doped region. A second well region of a second conductivity type is in the second semiconductor region and has a first peak dopant concentration. A third well region of the second conductivity type in the second semiconductor region adjacent to an edge of the second well region. The third well region is interposed between the first well region and the second well region, the third well region and the first well region are laterally spaced apart so that a portion of the second semiconductor region is interposed between the third well region and the first well region, and the third well region has a second peak dopant concentration that is different than the first peak dopant concentration. A doped anode region of the second conductivity type is in the first well region. A doped cathode region of the first conductivity type is in the second well region. A doped contact region of the second conductivity type is in the second well region. A first doped region of the first conductivity type is in the first well region interposed between the doped anode region and the second well region.

In an example, a method of forming a semiconductor device includes providing a region of semiconductor material with a top side, a bottom side opposite to the top side, a semiconductor substrate, a first semiconductor region over the semiconductor substrate, a buried doped region of a first conductivity type in the first semiconductor region, and a second semiconductor region over the first semiconductor region and the buried doped region. The method includes providing a first well region of the first conductivity type in the second semiconductor region and electrically coupled to the buried doped region. The method includes providing a second well region of a second conductivity type opposite to the first conductivity type in the second semiconductor region and having a first peak dopant concentration. The method includes providing a third well region of the second conductivity type in the second semiconductor region abutting edges of the second well region, wherein the third well region is interposed between the first well region and the second well region, the third well region and the first well region are laterally spaced apart so that a portion of the second semiconductor region is interposed between the third well region and the first well region, and the third well region has a second peak dopant concentration that is different than the first peak dopant concentration. The method includes providing a doped anode region of the second conductivity type in the first well region. The method includes providing a doped cathode region of the first conductivity type in the second well region. The method includes providing a doped contact region of the second conductivity type in the second well region.

Other examples are included in the present disclosure. Such examples may be found in the figures, in the claims, or in the description of the present disclosure.

Figure 1B:
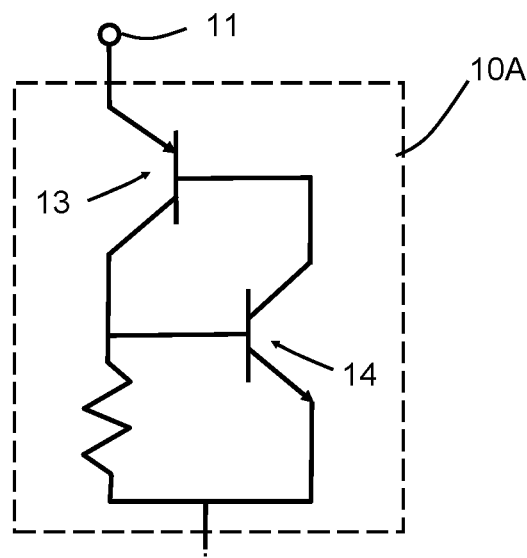
FIG. 1B schematically illustrates a circuit representation of the semiconductor device of FIG. 1A.
Figure 1B:
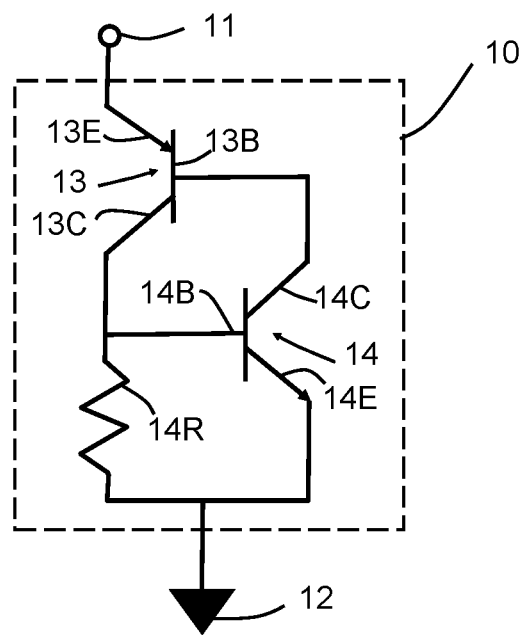

FIG. 1A is a simplified cross-sectional view of a semiconductor device 10 as an embodiment of an electrostatic discharge (ESD) protection device 10 or ESD device 10 configured as an SCR device. FIG. 1B schematically illustrates a transistor circuit representation of ESD device 10.

As shown in FIG. 1A, ESD device 10 is a four-layer P-N-P-N semiconductor structure with an anode terminal 11 and a cathode terminal 12. SCR devices are effective in blocking current through anode terminal 11 and cathode terminal 12 until the SCR device is turned on by a triggering mechanism. As will be described in more detail later, such a triggering mechanism can include raising the positive voltage across the SCR device (i.e., the anode positive with respect to the cathode) to a peak value referred to as the trigger voltage (Vt1) or the (forward biased) DC breakdown voltage of the SCR device.

With reference to both FIG. 1A and FIG. 1B, SCR devices can be described using a two-transistor analogy that includes a PNP transistor 13 connected with an NPN transistor 14. Region 13E is an emitter region, region 13B is a base region, and region 13C is a collector region respectively of PNP transistor 13. Emitter region 13E and base region 13B form a junction J1, and base region 13B and collector region 13C form a junction J2. Region 14E is an emitter region, region 14B is a base region, and region 14C is a collector region respectively of NPN transistor 14. Emitter region 14E and base region 14B form a junction J3, and base region 14B and collector region 14C are defined by junction J2.

Emitter region 13E is connected to anode terminal 11, which can be also be connected as an input supply terminal for associated system components that ESD device 10 is configured to protect. Emitter 14E is connected to cathode terminal 12. In the present example, base region 14B of NPN transistor 14 also is connected to cathode terminal 12, which provides a resistive path (designated as element 14R in FIG. 1B) that can be used to control the base current gain of NPN transistor 14.

As shown in FIGS. 1A and 1B, collector region 14C of NPN transistor 14 is in common with base region 13B of PNP transistor 13, and base region 14B of NPN transistor 14 is in common with collector region 13C of PNP transistor 13. More particularly, junction J2 functions as the collector junction for both transistors. In this configuration, the collector current of PNP transistor 13 drives base region 14B of NPN transistor 14, and the base current of the PNP transistor 13 is dictated by the collector current of NPN transistor 14.

With an applied voltage across anode terminal 11 and cathode terminal 12 (anode positive with respect to cathode) that is below the trigger voltage of ESD device 10, no current will flow through the device, except for a small leakage current from the forward biased junctions J1 and J3. As the applied voltage across anode terminal 11 and cathode terminal 12 increases to Vt1, collector leakage current from PNP transistor 13 (which is also the base current for NPN transistor 14) becomes large enough to turn on NPN transistor 14. Once NPN transistor 14 is turned on, its collector current provides base current to PNP transistor 13 as a feedback mechanism to keep ESD device 10 latched in a conducting state. In the conducting state, current conduction in the SCR device increases to a holding point corresponding to a holding current (Ihold) and a holding voltage (Vhold). Depending on the internal impedance of the voltage source, current and voltage may further increase to a point corresponding to a current (It2) and a voltage (Vt2), beyond which destructive failure may occur. It2 can be referred to as the damage onset current threshold of the SCR device. The holding current is the minimum conducting state current required to keep ESD device 10 in the conduction state. To turn ESD device off, the current flowing through the device must fall below the holding current. This can be done, for example, by reducing the applied voltage to a level that turns off the feedback mechanism.

ESD device 10 is intended to remain in an inactive state during normal operation (Vo) of the associated system components ESD device 10 protects but turns on when excessive voltage occurs. In this way ESD device 10 protects the associated system components from damage or destruction. The trigger voltage Vt1 of ESD device 10 should exceed the maximum normal DC operating voltage of associated system components it is protecting. In addition, Vt1 should be less than a transient voltage large enough to damage the associated systems components.

In accordance with the present description and as will be described in more detail later, base region 14B of ESD device 10 is provided as a P-type multiple-well structure at the cathode side where the peak dopant concentration of one part of the multiple-well structure (for example, well region 212 in FIG. 2) is configured to control the holding voltage of ESD device 10, and the peak dopant concentration of another part of the multiple-well structure (for example, well region 213 in FIG. 2) is configured to control the DC breakdown voltage of ESD device 10. That is, the peak dopant concentration of the one part of the multiple-well structure is different that the peak dopant concentration of another part of the multiple-well structure. Also, an additional a higher doped N-type region is added to the N-type well at the anode side as a high field region. As a result, a higher holding voltage and an adjustable DC breakdown voltage for ESD device 10 is achieved.

Figure 1C:
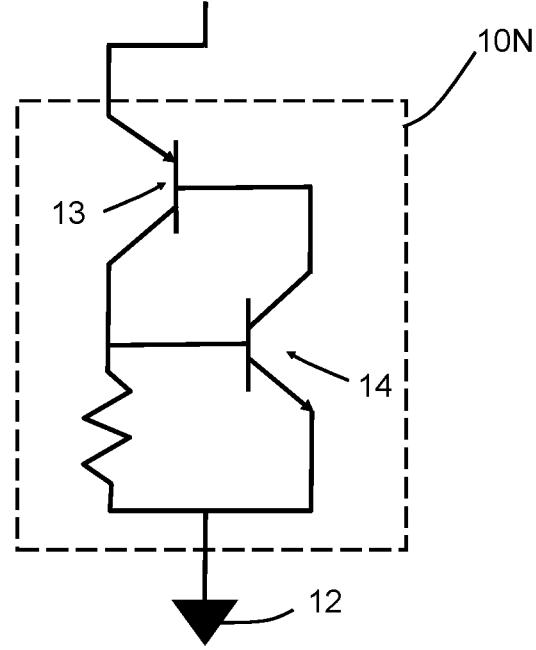
FIG. 1C schematically illustrates a circuit representation of a semiconductor device configured as an ESD device in a stacked configuration in accordance with the present description.

FIG. 1C schematically illustrates a circuit representation 101 of a semiconductor device configured as an ESD device in a stacked configuration. In accordance with the present description, a plurality of semiconductor devices 10 (denoted as devices 10A to 10N in FIG. 1C) are connected or stacked together in series. In this way, an ESD device is provided having a higher holding voltage and a higher breakdown voltage. In some examples, the holding voltage and breakdown voltage can be doubled or tripled in a 2-stack or 3-stack configuration respectively. In accordance with the present description, the active device regions of semiconductor device 10 are lateral device regions isolated from the underlying semiconductor substrate, which enables the stacking configurations of the present description.

Figure 2:
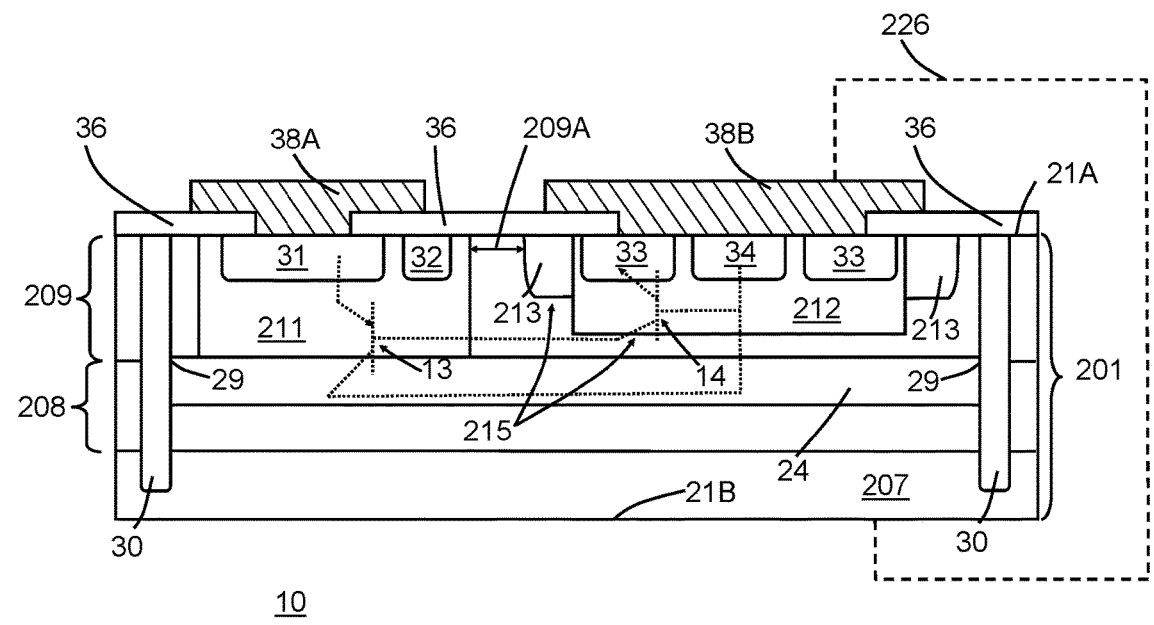
FIG. 2 illustrates a cross-sectional view of a semiconductor device in accordance with the present description.

FIG. 2 illustrates a cross-sectional view of an example embodiment of semiconductor device 10 configured as a two-terminal SCR ESD device in accordance with the present description. Semiconductor device 10 includes a region of semiconductor material 201 that has a top side 21A and a bottom side 21B opposite to the top side. Region of semiconductor material 201 includes a semiconductor substrate 207 and semiconductor region 208 overlying semiconductor substrate 207. In some examples, semiconductor substrate 207 can have a P-type conductivity. In other examples, semiconductor substrate 207 can have an N-type conductivity. Since semiconductor substrate can have different conductivity types, various substrate embodiments are supported.

In some examples, semiconductor substrate 207 is a silicon substrate and has a dopant concentration greater than $1.0\times10^{13}$ atoms/cm$^3$. In some examples, semiconductor region 208 can be formed using epitaxial growth techniques and has a P-type conductivity or an N-type conductivity and a low dopant concentration, for example, a dopant concentration less than $5.0\times10^{14}$ atoms/cm$^3$.

Region of semiconductor material 201 includes a buried doped region 24 is in or adjacent to semiconductor region 208 and has an N-type conductivity and, in some examples, has a peak dopant concentration of $1\times10^{19}$ to $1\times10^{29}$ atoms/cm$^3$. In some examples, after semiconductor region 208 is formed over semiconductor substrate 207, a masking material can be provided over semiconductor region 208 with openings where N-type dopant are provided into the surface of semiconductor region 208 in predetermined areas. In some examples, photolithography masking or hard masking techniques can be used to provide the masking material, and ion implantation can be used to provide the N-type dopant for buried doped region 24. In some examples, semiconductor region 208 has a thickness in range from 2 microns to 7 microns. Semiconductor region 208 is an example of a first semiconductor region.

Region of semiconductor material 201 includes a semiconductor region 209 over semiconductor region 208 and buried doped region 24. In some examples, semiconductor region 209 can be formed using epitaxial growth techniques and has a P-type conductivity type or an N-type conductivity and a low dopant concentration, for example, less than $5.0\times10^{14}$ atoms/cm$^3$. In the present example, semiconductor region 209 can be configured as a drift region for junction J2 of semiconductor device 10. In some examples, during the formation of semiconductor region 209, dopant for buried doped region 24 diffuses into semiconductor regions 208 and 209 to form buried doped region 24. In some examples, buried doped region 24 has a thickness in a range from 2 microns to 5 microns and semiconductor region 209 has a thickness in a range from 2.5 microns to 8 microns. Semiconductor region 209 is an example of a second semiconductor region.

In some examples, semiconductor device 10 includes isolation structure 29 that extends from top side 21A of region of semiconductor material 201 inward to semiconductor substrate 207. In accordance with the present description, buried doped region 24 laterally extends from a first portion of isolation structure 29 to a second portion of isolation structure 29 as shown in FIG. 2. In this way, isolation structure 29 and semiconductor region 208 electrically isolate semiconductor region 209 from semiconductor substrate 207. In some examples, isolation structure 29 is a deep-trench isolation structure, which can be formed by etching one or more trenches into region of semiconductor material 201. Techniques for forming deep trenches can include masking and semiconductor material etching techniques. In some examples, a dielectric liner 30 can be formed along sidewall and bottom surfaces of the trenches. In other examples, the trenches can be filled with one or more dielectrics or a dielectric in combination with an undoped polysilicon. Isolation structure 29 provided as a deep-trench isolation structure can provide for smaller spacing or geometries, which can facilitate, among other things, the stacking semiconductor device 10 as described in conjunction with FIG. 1C. However, it is understood that other isolation structures can be used instead of a deep-trench isolation structure or in combination therewith.

Semiconductor device 10 further includes a well region 211 having an N-type conductivity, which extends inward from top side 21A into semiconductor region 209. In the example illustrated in FIG. 2, well region 211 extends to contact buried doped region 24, which also has N-type conductivity as described previously. In some examples, well region 211 has a peak dopant concentration of $1\times10^{15}$ to $5\times10^{18}$ atoms/cm$^3$. In some examples, well region 211 can be formed using masking, ion implantation, and anneal/diffusion techniques. Well region 211 is an example of a first well region.

In accordance with the present description, semiconductor device 10 includes a multiple-well region 215 having a P-type conductivity, which includes a well region 212 and a well region 213 that abuts one or more outer edges of well region 212. Multiple-well region 215 extends inward from top side 21A into semiconductor region 209 but does not contact buried doped region 24. That is, a portion of semiconductor region 209 is interposed between the upper side of buried doped region 24 and the lower side of multiple-well region 215. In accordance with the present description, a portion of well region 213 is interposed between well region 211 and well region 212. In addition, a portion of semiconductor region 209 is interposed between well region 211 and well region 213 as illustrated in FIG. 2. More particularly, well region 211 is separated from well region 213 by a space 209A. Space 209A is used to together with other design parameters of semiconductor device 10 discussed below to set the DC breakdown voltage. In some examples, space 209A is between 0 micron and 5 microns.

In some examples, well region 213 and well region 212 extend to different depths within semiconductor region 209. In some examples, well region 213 extends to a depth that is less than that of well region 212 as illustrated in FIG. 2. In other examples, the depths can be the same, or well region 213 can extend to a depth that is greater than that of well region 212. In some examples, well region 213 has a peak dopant concentration that is different than the peak dopant concentration of well region 212. In some examples, well region 213 has a peak dopant concentration less than the peak dopant concentration of well region 212. In some examples, well region 213 has a peak dopant concentration between $1\times10^{15}$ atoms/cm$^3$ and $5\times10^{18}$ atoms/cm$^3$, and well region 212 has peak dopant concentration of $1\times10^{15}$ atoms/cm$^3$ and $5\times10^{18}$ atoms/cm$^3$. It is understood that the peak dopant concentrations of well region 212 and 213 can be varied to support different targeted DC breakdown voltages and holding voltages in accordance with the present description.

In some examples, well region 213 can surround well region 212 in a top plan view. In other examples, well region 213 can have a bar or stripe shape and can be placed on one or more sides of well region 212 where at least one side is between well region 211 and well region 212. Well region 212 is an example of a second well region and well region 213 is an example of a third well region. Well region 212 and well region 213 can be formed using masking, ion implantation, and anneal/diffusion techniques.

In accordance with the present description, well region 213 is configured to control the DC breakdown voltage of semiconductor device 10. More particularly, well region 213 provides a reduced surface field (RESURF) effect within the drift region of semiconductor region 209 to reduce the electrical field build-up of junction J2 thereby increasing DC breakdown voltage. In addition, since well region 213 is a separate P-type well region, well region 212 can be designed to enhance other electrical characteristics of semiconductor device 10 including the holding voltage. For example, since well region 212 can have a different peak dopant concentration than well region 213, well region 212 can have a higher peak dopant concentration to provide a higher holding voltage. More particularly, the characteristics of well region 212 can be used to set some electrical parameters of semiconductor device 10, and the characteristics of well region 213 can be used to set other electrical parameters of semiconductor device 10. This is different than prior devices where a single P-well region was used with tradeoffs to achieve DC breakdown voltage and holding voltage. This resulted in the prior devices having lower than desired electrical performance and limited design flexibility.

Semiconductor device 10 further includes a doped region 31 within well region 211, which has a P-type conductivity type. In some examples, doped region 31 has a peak dopant concentration of $1\times10^{19}$ to $1\times10^{21}$ atoms/cm$^3$ and can be formed using masking, ion implantation, and anneal/diffusion techniques. Doped region 31 forms junction J1 of semiconductor device 10 with well region 211. Doped region 31 can also be referred to as a doped anode region.

Figure 3:
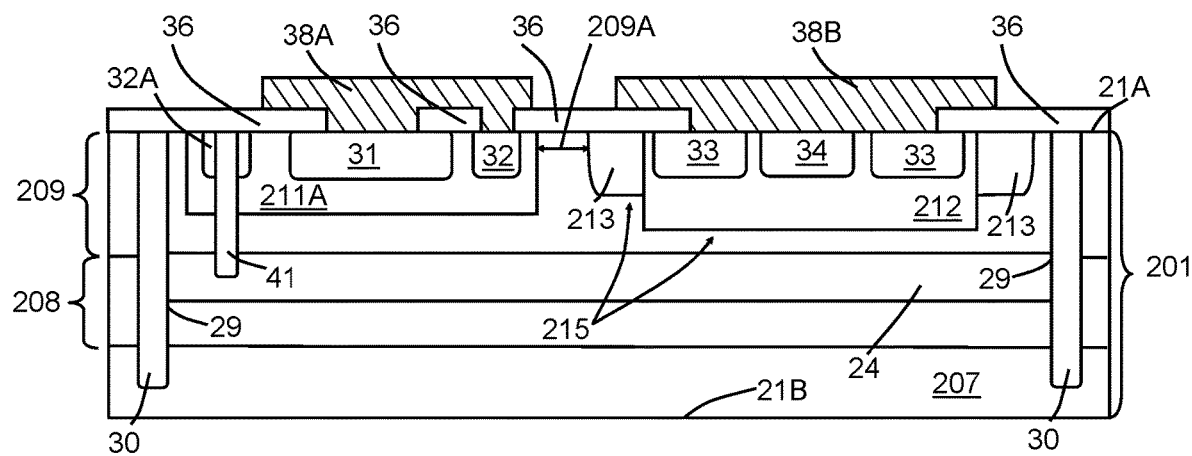
FIG. 3 illustrates a cross-sectional view of a semiconductor device in accordance with the present description.

In accordance with the present description, semiconductor device 10 further includes a doped region 32 within well region 211 and laterally spaced apart from doped region 31. Doped region 32 is interposed between doped region 31 and well region 213 and can be laterally spaced apart from doped region 31. Doped region 32 has an N-type conductivity and can have a peak dopant concentration of $1\times10^{19}$ to $1\times10^{21}$ atoms/cm$^3$. Doped region 32 can be electrically floating as illustrated in FIG. 2 or can be electrically connected to conductor 38A as illustrated in FIG. 3. In accordance with the present description, doped region 32 functions as a high field region that modulates the current flow of PNP transistor 13 to increase the holding voltage of semiconductor device 10. More particularly, doped region 32 forces current from junction J1 downward and away from the surface of well region 211 towards buried doped region 24.

Semiconductor device 10 further includes doped regions 33 within well region 212, which have an N-type conductivity and form junction J3 of semiconductor device 10. In some examples, doped regions 33 can have a peak dopant concentration of $1\times10^{19}$ to $1\times10^{21}$ atoms/cm$^3$ and can be formed using masking, ion implantation, and anneal/diffusion techniques. Doped region 33 can also be referred to as doped cathode regions. A doped region 34 is within well region 212, has a P-type conductivity, and a peak dopant concentration of $1\times10^{19}$ to $1\times10^{21}$ atoms/cm$^3$. In some examples, doped region 34 functions as a resistive connection (element 14R in FIG. 1B) between well region 212 and conductor 38B and can be used to modulate the base current for NPN transistor 14. For example, doped region 34 can be used to help set the holding current for semiconductor 10 by increasing or decreasing the size of doped region 34. More particularly, a larger doped region 34 increases the holding current and a smaller doped region 34 decreases the holding current.

In some examples, doped region 34 is laterally spaced apart from doped regions 33 so that portion of well region 212 is interposed between doped regions 33 and doped region 34. In other examples, doped regions 33 can abut doped region 34. Doped regions 33 and 34 can be formed using masking, ion implantation, and anneal/diffusion techniques.

Semiconductor device 10 dielectric 36 over top side 21A of region of semiconductor material 201. Dielectric 36 can be provided prior to the formation of doped regions 33 and 34 and can comprise one or more dielectric layers including for example, a field dielectric layer and a pre-ohmic dielectric layer. In some examples, dielectric 36 comprises an oxide, a nitride, combinations thereof, or other dielectrics as known to one of ordinary skill the art. Dielectric 36 can be provided using thermal growth processes or chemical vapor deposition processes. Dielectric 36 can be patterned to provide openings for doped regions 31, 33, and 34 and well region 212 using, for example, photolithographic and etch processes.

Semiconductor device 10 further includes conductors 38A and 38B over dielectric 36 with conductor 38A contacting doped region 31 and conductor 38B contacting doped regions 33 and 34 and well region 212 through openings in dielectric 36. In the present example, conductor 38A provides anode terminal 11 and conductor 38B provides cathode terminal 12 for semiconductor device 10. In some examples, conductors 38A and 38B comprises one or more metals or metal layers. In some examples, conductors 38A and 38B can comprise an aluminum alloy, such as aluminum (Al)-silicon (Si)-copper (Cu) alloy. In some examples, a solderable material or sintering material is provided over the aluminum alloy. In other examples, conductors 38A and 38B can comprise titanium (Ti) nickel (Ni) silver (Ag) or chromium (Cr) Ni gold (Au). Conductors 38A and 38B can be formed using evaporation, sputtering, or other deposition techniques. In some examples, conductors 38A and 38B have a thickness between about 2 microns and 9 microns.

In accordance with the present description, the active device regions of semiconductor device 10 are isolated from semiconductor substrate 207 by isolation structures 29 and buried doped region 24. This enables the stacking of semiconductor device 10 as described in conjunction with FIG. 1C. In some examples, conductor 38B can be electrically connected to bottom side 21B of region of semiconductor material 201 as illustrated by connection 226 in FIG. 2. The electrical connection can be done at the package level through an interconnect, such as wire bond or clip. In other examples, the electrical connection can be done with a conductive via extending through region of semiconductor material 201.

FIG. 3 illustrates a cross-sectional view of an example embodiment of semiconductor device 20 configured as a two-terminal SCR ESD device in accordance with the present description. Semiconductor device 20 has some similarity in construction to semiconductor device 10. In this regard, only the distinctions between the two devices will be described hereinafter. In semiconductor device 20, N-type well region 211A is provided within semiconductor region 209 but does not extend all the way to buried doped region 24. That is, a portion of semiconductor region 209 is interposed between an upper side of buried doped region 24 and the lower side of well region 211A. Semiconductor device 20 further includes a doped region 32A, which is an N-type conductivity region that can be formed with the same characteristics as doped region 32 described previously. A contact region 41 electrically connects doped region 32A to buried doped region 24. In some examples, a trench is etched extending from top side 21A through doped region 32A, well region 211A, semiconductor region 209 and into buried doped region 24. The trench can be etched using similar processing as described in isolation structures 29. In some examples, a conductor can then be formed in the trench and comprise, for example, doped polysilicon or other conductive materials.

In addition, in semiconductor device 20, doped region 32 is illustrated as optionally electrically connected to conductor 38A. An additional opening can be provided in dielectric 36 using masking and etch techniques over doped region 32 to allow for electrical connection between doped region 32 and conductor 38A as illustrated in FIG. 3.

Figure 4:
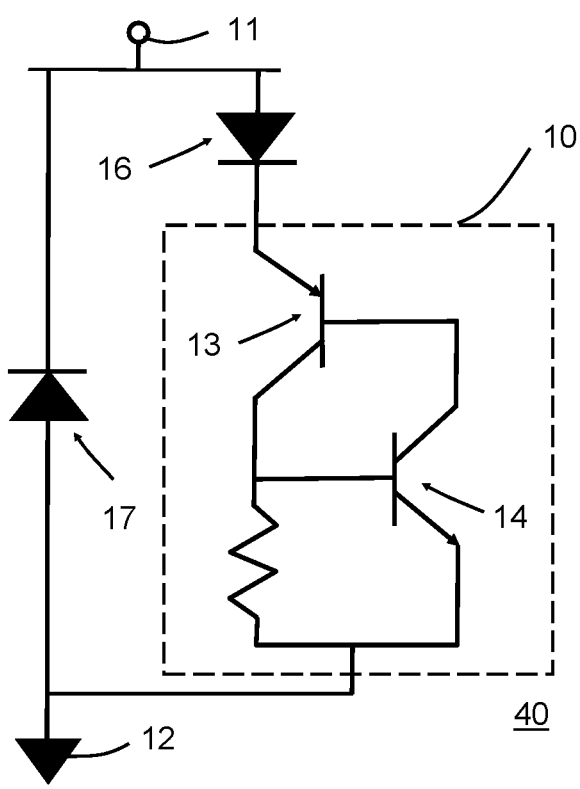
FIG. 4 schematically illustrates a portion of a circuit representation of a semiconductor device configured as an ESD device in accordance with the present description.

FIG. 4 schematically illustrates a portion of a circuit representation of a semiconductor device 30 configured as an ESD device in accordance with the present description. Semiconductor device 30 includes semiconductor device 10 as described previously, and further includes a steering diode 16 connected between anode terminal 11 and the emitter terminal of PNP transistor 13. In addition, semiconductor device 30 includes a diode 17 having an anode connected to terminal 11 and an anode connected to terminal 12.

Semiconductor device 30 is configured as a bi-directional ESD device. When terminal 11 is exposed to a positive ESD event, diode 17 is under reverse bias and steering diode 16 is under a forward bias thereby passing the current to semiconductor device 10. Under a negative ESD event, steering diode 16 is under reverse bias and diode 17 is under forward bias thereby passing the current to terminal 12. The breakdown voltages of diodes 16 and 17 and the characteristics of semiconductor device 10 are designed in conjunction with the ESD requirements of the system application components semiconductor device 30 is intended to protect. Such requirements can include the maximum normal DC operating voltage of associated system components it is protecting and the trigger voltage of semiconductor device 10 and the breakdown voltage of diode 17 should be less than a transient voltage large enough to damage the associated systems components.

In some examples, steering diode 16 can be small to minimize its zero-bias capacitance. Since the capacitance of capacitors in series is smaller than that of the smallest capacitor, the capacitance resulting from diode 16 and semiconductor device 10 at this zero-bias condition is smaller than the capacitance of either diode 16 or semiconductor device 10. This provides semiconductor device 30 as a low-capacitance ESD protection solution.

Figure 5:
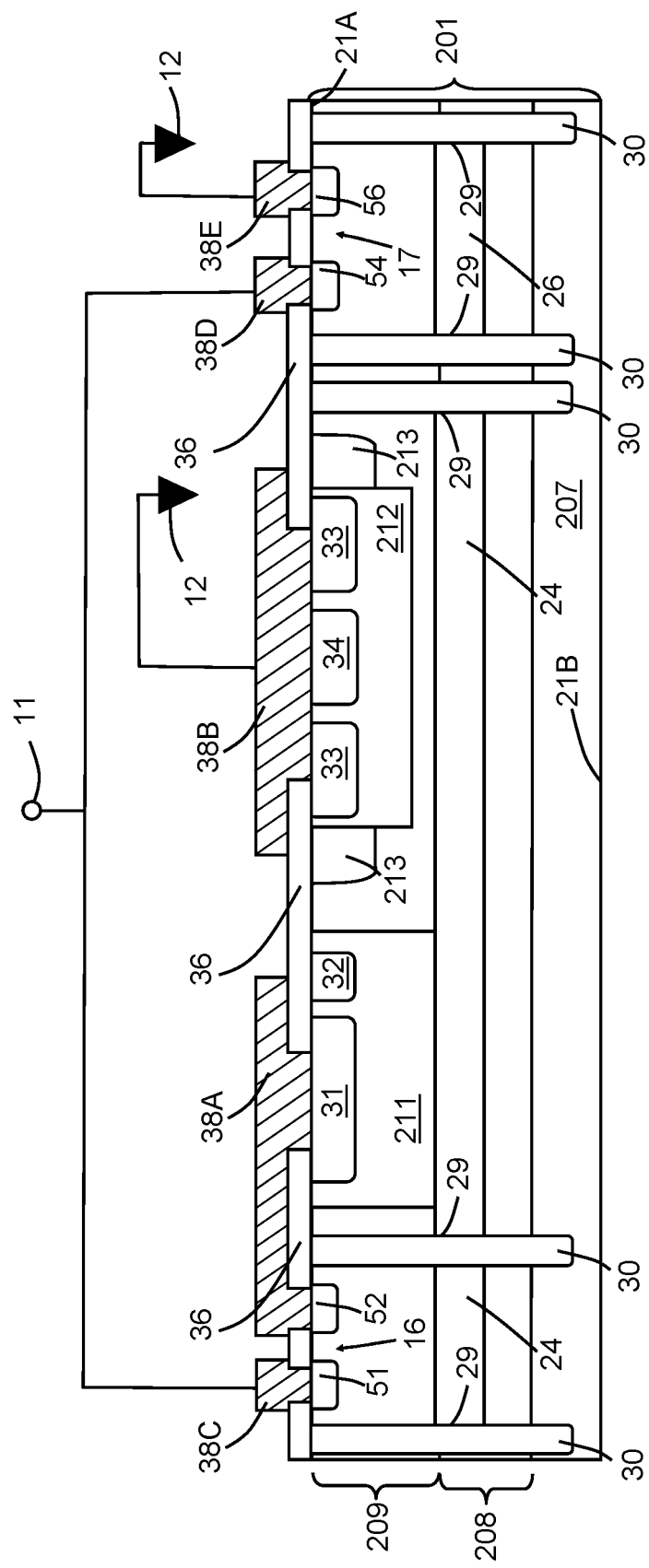
FIG. 5 illustrates a cross-sectional view of a semiconductor device in accordance with the present description.

FIG. 5 illustrates a cross-sectional view of an example of semiconductor device configured as a low-capacitance, a two-terminal SCR ESD device in accordance with the present description. Semiconductor device 30 has some similarity in construction to semiconductor device 10. In this regard, only the distinctions between the two devices will be described hereinafter. Semiconductor device 30 includes additional portions within semiconductor region 209 separated by isolation structures 29 for diode 16 and diode 17. In some examples, a doped region 51 having a P-type conductivity is provided in a portion of semiconductor region 209 to provide an anode for diode 16 and a doped region 52 having an N-type conductivity it provided in the semiconductor region 209 and laterally spaced apart from doped region 51. In some examples, buried doped region 24 extends to underlie doped region 51 and 52 to isolate diode 16 from semiconductor substrate 207. In the present example, diode 16 is provided as a lateral diode, and the dopant concentrations and sizes of the doped regions 51 and 52 and selected to minimize the zero-bias capacitance of diode 16. Additional openings can be provided in dielectric 36 to exposed portions of doped regions 51 and 52. A conductor 38C can be provided electrically connected to doped region 51 and terminal 11, and conductor 38A can be extended to electrically connect the cathode (doped region 52) of diode 16 to the emitter (doped region 31) of PNP transistor 13.

In some examples, a doped region 54 having an N-type conductivity is provided in another portion of semiconductor region 209 to provide a cathode for diode 17 and a doped region 56 having a P-type conductivity is provided in the other portion of semiconductor region 209 laterally spaced apart from doped region 54. A buried doped region 26 is provided underlying doped regions 54 and 56 and isolates diode 17 from semiconductor substrate 207. The spacing, size, and dopant concentrations of doped regions 54 and 56 are selected to provide pre-determined breakdown voltage of diode 17. Additional openings can be provided in dielectric 36 to expose portions of doped region 54 and 56. A conductor 38D can be electrically connected to doped region 54 and terminal 11 and a conductor 38E can be electrically connected to doped region 56 and ground. The openings in dielectric 36 can be formed as described previously and conductors 38C, 38D, and 38E can be formed as described previously for conductors 38A and 38B. Buried doped region 26 can be formed similarly to buried doped region 24 as described previously except a P-type dopant is used instead of an N-type dopant.

Figure 6:
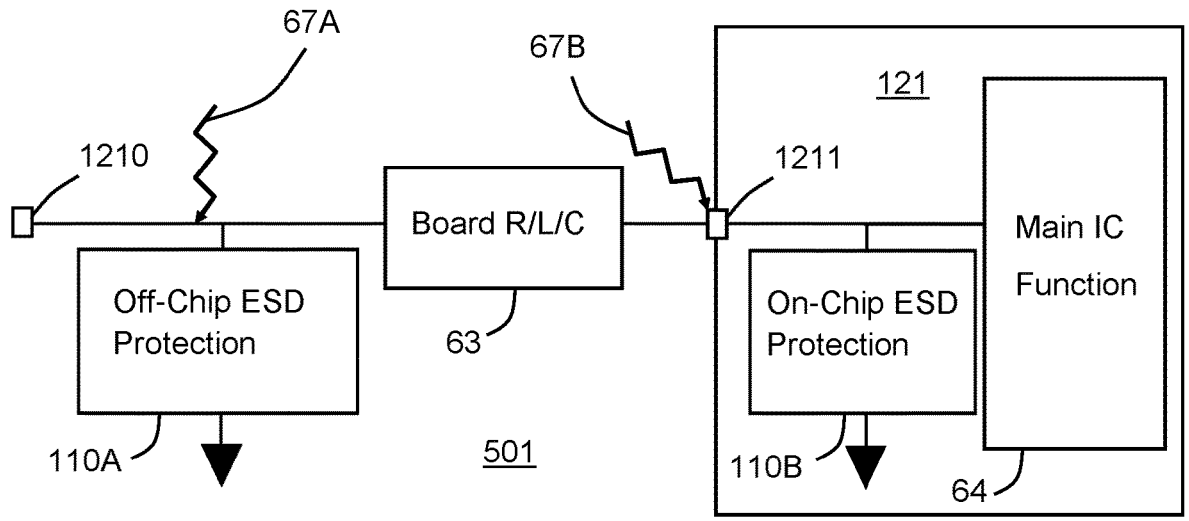
FIG. 6 schematically illustrates an example system representation using one or more of the semiconductor devices in accordance with the present description.

FIG. 6 illustrates an example system representation 501 using one or more of the semiconductor devices described herein in accordance with the present description. For example, semiconductor devices 10, 20, or 40 can be used as off-chip ESD protection device 110A. For example, semiconductor devices 10, 20, or 40 can be provided as separately packaged semiconductor devices mounted to a substrate, such as a printed circuit board and electrically connected to a system input terminal 1210. In this example, off-chip ESD protection device 110A can be placed between system input terminal 1210 and board level components 63 (for example, resistors, inductors, capacitors, etc.) and integrated circuit (IC) 121 having a main IC function 64. Off-chip ESD protection device 110A protects from board level components 63 and integrated circuit 121 from a system level ESD event 67A. Off-chip ESD protection device 110A can be designed in accordance with applicable ESD standards, such as IEC61000-4-2 and IEC61000-4-5.

In other examples, semiconductor device 10, 20, or 40 can integrated as on-chip ESD protection device 110B as part of integrated circuit 121. In this example, on-chip ESD protection device 110B is placed between a chip input terminal 1211 and main IC function 64 on integrated circuit 121 and protects main IC function 64 from a component level ESD event 67B occurring at chip input terminal 1211. On-chip ESD protection device 110B can be designed in accordance with applicable ESD models, such as the human body model (HBM) or the charge device model (CBM).

Figure 7:
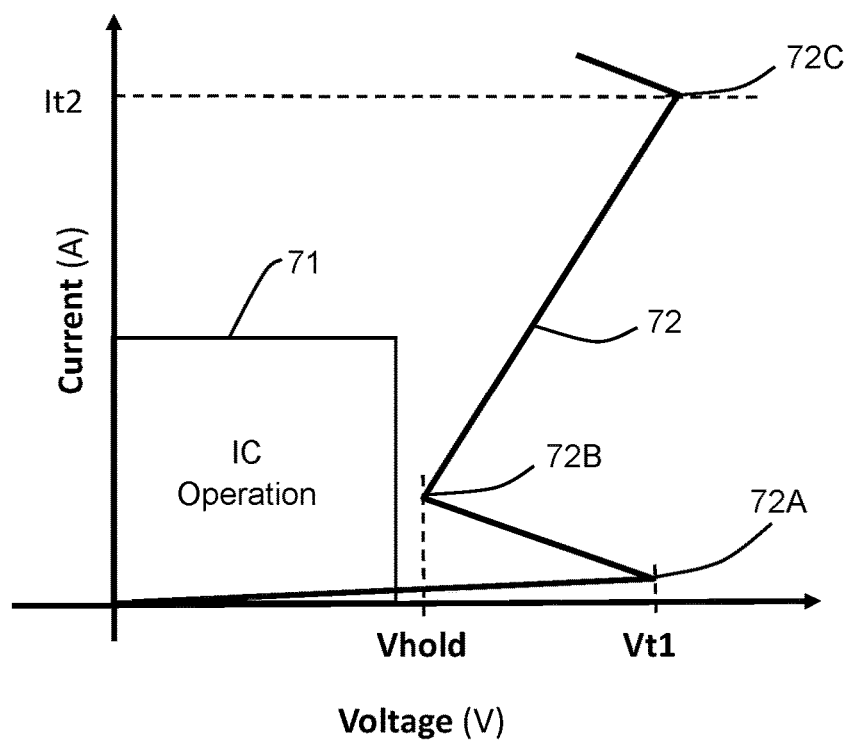
FIG. 7 graphically illustrates a current/voltage (IV) characteristic of a semiconductor device in accordance with the present description.

FIG. 7 graphically illustrates a current/voltage (IV) characteristic 72 for semiconductor devices 10, 20, or 40 in accordance with the present description with positive voltage applied to conductor 38A (terminal 11) with respect to conductor 38B (terminal 12). In accordance with the present description, semiconductor devices 10, 20, or 40 are provided with multiple-well region 215 including well region 212 and well region 213 as described previously. Well region 213 has a different peak dopant concentration than well region 212 and is configured to set the DC breakdown voltage or trigger voltage (point 72A of IV characteristic 72) for semiconductor devices 10, 20, or 40. In addition, doped region 32 and well region 212 are configured to set the holding voltage and holding current (point 72B of IV characteristic 72) for semiconductor devices 10, 20, or 40. In accordance with the present description, the holding voltage can be higher than previous devices (for example, greater than 10 volts) and the DC breakdown voltage can adjusted according to desired specifications. In some examples, the DC breakdown voltage can be greater than 15 volts. In other examples, the DC breakdown voltage can be greater than 20 volts. In further examples, the DC breakdown voltage can be greater than 25 volts. In still further examples, the DC breakdown voltage can be greater than 30 volts. In addition, semiconductor devices 10, 20, and 40 can be provided in a stacked configuration as described in conjunction with FIG. 1C to further increase holding voltage and DC breakdown voltage.

Depending on the internal impedance of the voltage source, current and voltage may further increase to a point 72C corresponding to a current (It2) and a voltage (Vt2) beyond which destructive failure may occur. Semiconductor devices 10, 20, and 40 are designed to that holding voltage is greater than the maximum normal DC operating voltage for IC operation of IC 71 that semiconductor devices 10, 20, or 40 are protecting. In addition, the DC breakdown voltage of semiconductor devices 10, 20, or 40 should be less than the transient voltage large enough to damage IC 71.

Figure 8:
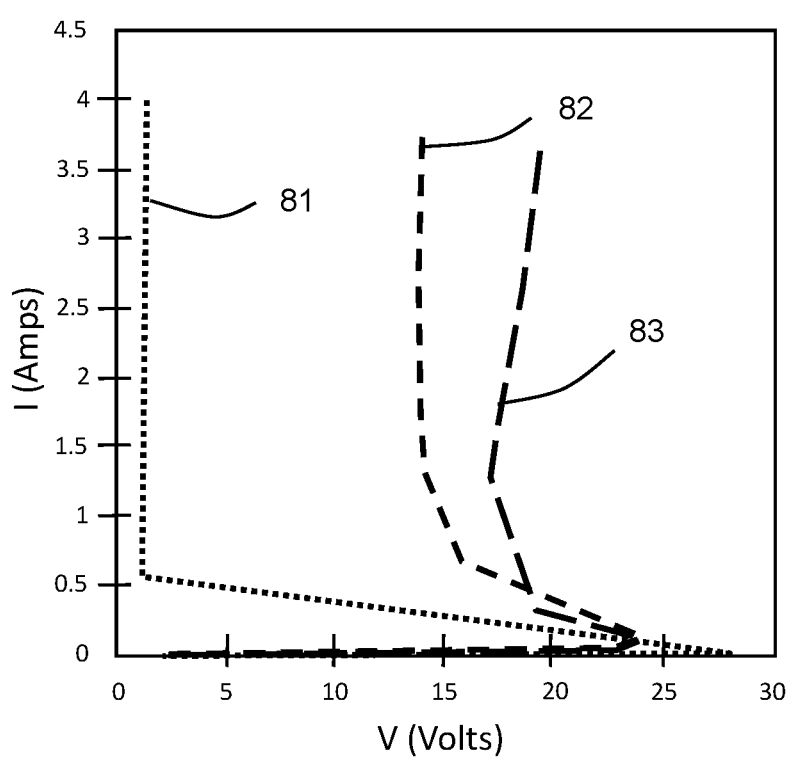
FIG. 8 graphically illustrates comparative IV characteristics of semiconductor devices in accordance description and a prior semiconductor device.

FIG. 8 graphically illustrates comparative current/voltage (IV) characteristics for semiconductor devices of the present description and a prior semiconductor device. More particularly, FIG. 8 compares IV characteristics 82 and 83 of semiconductor devices 10, 20, or 40 having a doped region 32 in well region 211 at the anode side with the IV characteristic 81 of a prior device that did not include dope region 32 as described herein. As shown in FIG. 8, the addition of doped region 32 significantly increases the holding voltage (for example, greater than 10 volts) compared to the prior device (much less than volts). IV characteristic 82 is an example for semiconductor devices 10 and 40 where doped region 32 is floating, and IV characteristic 83 is an example for semiconductor device 20 where doped region 32 is electrically connected to conductor 38A (terminal 11). It is understood that in other examples, doped region 31 can be used in a single P-well semiconductor device in accordance with the present description.

Example semiconductor devices in accordance with the present description were evaluated and good performance was achieved including low leakage as well as high It2 to pass, for example, IEC61000-4-2 and IEC61000-4-5 tests. In a first example, spacing 209A was 1 micron, semiconductor region 208 had a thickness of 4.5 microns, semiconductor region 209 had a thickness of 5.2 microns, an ion implantation dose of $5.0 \times 10^{13}$ atoms/cm$^2$ at 140 keV was used for P-type well region 212, an ion implantation dose of $3.0 \times 10^{13}$ atoms/cm$^2$ at 120 keV has used for P-type well region 213, and ion implantation dose of $1.0 \times 10^{14}$ atoms/cm$^2$ at 200 keV was used for N-type well region 211. In this example, the predicted DC breakdown voltage achieved was 22.3 volts (DC BV spec of 22 volts), the predicted leakage current was less than 1 nano-amp, the predicted It2 current was greater than 30 Amps (It2 spec of 30 Amps), and the predicted holding voltage was 12 volts (holding voltage spec of 10.5 volts).

In a second example similar to the first example except that semiconductor region 208 thickness was 6.1 microns, the predicted DC breakdown voltage was 22.2 volts and the holding voltage was 12.8 volts.

In a third example, spacing 209A was 3 microns, semiconductor region 208 had a thickness of 6.1 microns, semiconductor region 209 had a thickness of 5.2 microns, an ion implantation dose of $3.5 \times 10^{13}$ atoms/cm$^2$ at 140 keV was used for P-type well region 212, an ion implantation dose of $1.0 \times 10^{13}$ atoms/cm$^2$ at 120 keV has used for P-type well region 213, and ion implantation dose of $1.0 \times 10^{14}$ atoms/cm$^2$ at 200 keV was used for N-type well region 211. In this example, the predicted DC breakdown voltage achieved was 56.5 volts (DC BV spec of 55 volts), the predicted leakage current was less than 1 nano-amp, the predicted It2 current was greater than 30 Amps (It2 spec of 30 Amps), and the predicted holding voltage was 15 volts (holding voltage spec of 13 volts). This example can be used in a 2-stack embodiment to target a 110 volts DC breakdown voltage.

In a fourth example, spacing 209A was 1 micron, semiconductor region 208 had a thickness of 4.5 microns, semiconductor region 209 had a thickness of 5.2 microns, an ion implantation dose of $4.0 \times 10^{13}$ atoms/cm$^2$ at 140 keV was used for P-type well region 212, an ion implantation dose of $8.0 \times 10^{13}$ atoms/cm$^2$ at 120 keV has used for P-type well region 213, and ion implantation dose of $1.25 \times 10^{14}$ atoms/cm$^2$ at 200 keV was used for N-type well region 211. In this example, the predicted DC breakdown voltage achieved was 17.9 volts (DC BV spec of 17 volts), the predicted leakage current was less than 1 nano-amp, the predicted It2 current was greater than 30 Amps (It2 spec of 30 Amps), and the predicted holding voltage was 10.4 volts (holding voltage spec of 9.5 volts).

In a fifth example similar to the fourth example, except that semiconductor region 208 thickness was 6.1 microns, the predicted DC breakdown voltage was 18.0 volts and the holding voltage was 11.1 volts.

In a sixth example, spacing 209A was 2 microns, semiconductor region 208 had a thickness of 5 microns, semiconductor region 209 had a thickness of 5.2 microns, an ion implantation dose of $4.0 \times 10^{13}$ atoms/cm$^2$ at 140 keV was used for P-type well region 212, an ion implantation dose of $1.7 \times 10^{13}$ atoms/cm$^2$ at 120 keV has used for P-type well region 213, and ion implantation dose of $1.25 \times 10^{14}$ atoms/cm$^2$ at 200 keV was used for N-type well region 211. In this example, the predicted DC breakdown voltage achieved was 32.7 volts (DC BV spec of 32.5 volts), the predicted leakage current was less than 1 nano-amp, the predicted It2 current was greater than 30 Amps (It2 spec of 30 Amps), and the predicted holding voltage was 8.3 volts (holding voltage spec of 7.5 volts).

In a seventh example similar to the sixth example except that semiconductor region 208 thickness was 6.1 microns and an ion implantation dose $3.4 \times 10^{13}$ atoms/cm$^2$ at 140 keV was used for P-type well region 212, the predicted DC breakdown voltage was 33.5 volts, and the holding voltage was 8.4 volts.

In view of the above results, it is apparent that the structures and methods of the present description can be adjusted to meet different product requirements using different design or process parameters to tune the semiconductor devices. This is a manufacturing advantage.

It is understood that the different examples described herein can be combined with any of the other examples described herein to obtain different embodiments.

In addition, it is understood that different semiconductor materials can be selected for semiconductor substrate 207, semiconductor region 208, or semiconductor region 209. In some examples, semiconductor substrate 207, semiconductor region 208, and semiconductor region 209 can be silicon. However, the present description is relevant to other materials including other heterojunction semiconductor materials, such as SiGe, SiGeC, GaAs, InGaP, GaN, and AlN. Further, semiconductor substrate 207 and semiconductor regions 208 and 209 can be the same or different materials.

While the subject matter of the invention is described with specific preferred examples, the foregoing drawings and descriptions thereof depict only typical examples of the subject matter and are not therefore to be considered limiting of its scope. It is evident that many alternatives and variations will be apparent to those skilled in the art. For example, the conductivity types of the various regions can be reversed. In addition, other isolation techniques can be used to isolate the active device regions. It is understood that the term semiconductor substrate can refer to an individual semiconductor die, a plurality of semiconductor die, or a semiconductor wafer.

As the claims hereinafter reflect, inventive aspects may lie in less than all features of a single foregoing disclosed example. Thus, the hereinafter expressed claims are hereby expressly incorporated into this Detailed Description of the Drawings, with each claim standing on its own as a separate example of the invention. Furthermore, while some examples described herein include some, but not other features included in other examples, combinations of features of different examples are meant to be within the scope of the invention and meant to form different examples as would be understood by those skilled in the art.

What is claimed is:

1. A semiconductor device, comprising:
a region of semiconductor material comprising:
a top side;
a bottom side opposite to the top side;
a semiconductor substrate;
a first semiconductor region over the semiconductor substrate;
a buried doped region of a first conductivity type in the first semiconductor region; and
a second semiconductor region over the first semiconductor region and the buried doped region;
a first well region of the first conductivity type in the second semiconductor region and electrically coupled to the buried doped region;
a second well region of a second conductivity type opposite to the first conductivity type in the second semiconductor region and having a first peak dopant concentration;
a third well region of the second conductivity type in the second semiconductor region abutting edges of the second well region, wherein:
the third well region is interposed between the first well region and the second well region;
the third well region and the first well region are laterally spaced apart so that a portion of the second semiconductor region is interposed between the third well region and the first well region; and
the third well region has a second peak dopant concentration that is different than the first peak dopant concentration;
a doped anode region of the second conductivity type in the first well region;
a doped cathode region of the first conductivity type in the second well region; and
a doped region of the second conductivity type in the second well region.

2. The semiconductor device of claim 1, further comprising:
a first doped region of the first conductivity type in the first well region interposed between the doped anode region and the second well region.

3. The semiconductor device of claim 2, further comprising:
a first conductor coupled to the doped anode region and the first doped region.

4. The semiconductor device of claim 2, wherein:
the first doped region is electrically floating.

5. The semiconductor device of claim 1, wherein:
the second peak dopant concentration is less than the first peak dopant concentration.

6. The semiconductor device of claim 1, wherein:
the second peak dopant concentration is greater than the first peak dopant concentration.

7. The semiconductor device of claim 1, further comprising:
a first conductor coupled to the doped anode region; and
a second conductor coupled to the doped cathode region and the doped region.

8. The semiconductor device of claim 7, wherein:
the second conductor is electrically coupled to the semiconductor substrate.

9. The semiconductor device of claim 1, wherein:
the first well region abuts the buried doped region.

10. The semiconductor device of claim 1, wherein:
the first well region is spaced part from the buried doped region; and
the semiconductor device further comprises a contact structure electrically coupling the first well region to the buried doped region.

11. The semiconductor device of claim 1, further comprising:
a steering diode structure in the second semiconductor region coupled in series with the doped anode region.

12. The semiconductor device of claim 1, wherein:
the semiconductor substrate is electrically isolated from the first well region, the second well region, and the third well region.

13. A semiconductor device, comprising:
a region of semiconductor material comprising:
a top side;
a bottom side opposite to the top side;
a semiconductor substrate;
a first semiconductor region over the semiconductor substrate;
a buried doped region of a first conductivity type in the first semiconductor region; and
a second semiconductor region over the first semiconductor region and the buried doped region;
a first well region of the first conductivity type in the second semiconductor region and electrically coupled to the buried doped region;
a second well region of a second conductivity type opposite to the first conductivity type in the second semiconductor region and having a first peak dopant concentration;

a third well region of the second conductivity type in the second semiconductor region adjacent to an edge of the second well region, wherein:
    the third well region is interposed between the first well region and the second well region;
    the third well region and the first well region are laterally spaced apart so that a portion of the second semiconductor region is interposed between the third well region and the first well region; and
    the third well region has a second peak dopant concentration that is different than the first peak dopant concentration;
a doped anode region of the second conductivity type in the first well region;
a doped cathode region of the first conductivity type in the second well region;
a doped region of the second conductivity type in the second well region; and
a first doped region of the first conductivity type in the first well region interposed between the doped anode region and the second well region.

14. The semiconductor device of claim 13, wherein:
the second semiconductor region has the second conductivity type.

15. The semiconductor device of claim 13, wherein:
the third well region is separated from the first well region by a space.

16. The semiconductor device of claim 13, further comprising:
an isolation structure extending from the top side, through the second semiconductor region, through the first semiconductor region, through the buried doped region, and into the semiconductor substrate, wherein:
    the isolation structure and the buried doped region electrically isolate the first well region, the second well region, and the third well region from the semiconductor substrate.

17. A method of forming a semiconductor device, comprising:
providing a region of semiconductor material comprising:
    a top side;
    a bottom side opposite to the top side;
    a semiconductor substrate;
    a first semiconductor region over the semiconductor substrate;
    a buried doped region of a first conductivity type in the first semiconductor region; and
    a second semiconductor region over the first semiconductor region and the buried doped region;
providing a first well region of the first conductivity type in the second semiconductor region and electrically coupled to the buried doped region;
providing a second well region of a second conductivity type opposite to the first conductivity type in the second semiconductor region and having a first peak dopant concentration;
providing a third well region of the second conductivity type in the second semiconductor region abutting edges of the second well region, wherein:
    the third well region is interposed between the first well region and the second well region;
    the third well region and the first well region are laterally spaced apart so that a portion of the second semiconductor region is interposed between the third well region and the first well region; and
    the third well region has a second peak dopant concentration that is different than the first peak dopant concentration;
providing a doped anode region of the second conductivity type in the first well region;
providing a doped cathode region of the first conductivity type in the second well region; and
providing a doped region of the second conductivity type in the second well region.

18. The method of claim 17, further comprising:
providing a first doped region of the first conductivity type in the first well region interposed between the doped anode region and the second well region.

19. The method of claim 17, wherein:
the second peak dopant concentration is less than the first peak dopant concentration.

20. The method of claim 17, wherein:
the second peak dopant concentration is greater than the first peak dopant concentration.

\* \* \* \* \*